United States Patent

Xiang et al.

[11] Patent Number: 5,233,302
[45] Date of Patent: Aug. 3, 1993

[54] MASKING MOTION GHOST ARTIFACTS IN NMR IMAGES

[75] Inventors: Qing-San Xiang; Ross M. Henkelman, both of Toronto, Canada

[73] Assignee: General Electric Company, Milwaukee, Wis.

[21] Appl. No.: 718,678

[22] Filed: Jun. 21, 1991

[51] Int. Cl.[5] ............................................. G01V 3/00
[52] U.S. Cl. ................................... 324/309; 324/307
[58] Field of Search ............... 324/309, 307, 306, 312; 128/653.2, 653.3

[56] References Cited

U.S. PATENT DOCUMENTS

| | | | |
|---|---|---|---|
| 4,649,346 | 3/1987 | Yeung et al. | 324/309 |
| 4,796,635 | 1/1989 | Dumoulin | 324/309 |
| 4,937,526 | 6/1990 | Ehman et al. | 324/309 |
| 4,968,935 | 11/1990 | Ehman et al. | 324/309 |

Primary Examiner—Louis Arana
Attorney, Agent, or Firm—Quarles & Brady

[57] ABSTRACT

An NMR imaging system performs a scan to acquire three sets of data which are Fourier transformed to produce three image data arrays. A corrected image data array is calculated from corresponding elements in the three acquired image data arrays. Image artifacts which cause ghosts in the reconstructed image are masked from the corrected image data by the calculations.

9 Claims, 6 Drawing Sheets

MASKING MOTION GHOST ARTIFACTS IN NMR IMAGES

BACKGROUND OF THE INVENTION

The field of the invention is nuclear magnetic resonance imaging methods and systems. More particularly, the invention relates to a method for reducing image artifacts caused by motion.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the z-y plane to produce a net transverse magnetic moment $M_1$, which is rotating, or spinning, in the x-y plane at the Larmor frequency. The degree to which the net magnetic moment $M_z$ is tipped, and hence the magnitude of the net transverse magnetic moment $M_1$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_1$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more excitation pulses ($B_1$) of varying magnitude and duration. Such excitation pulses may have a narrow frequency spectrum (selective excitation pulse), or they may have a broad frequency spectrum (nonselective excitation pulse) which produces transverse magnetization $M_1$ over a range of resonant frequencies. The prior art is replete with excitation techniques that are designed to take advantage of particular NMR phenomena and which overcome particular problems in the NMR measurement process. The present invention may be used with any of these pulse sequences.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques, such as multiple angle projection reconstruction and Fourier transform (FT). Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal. As is well known, the NMR signal may be a free indication decay (FID) or, preferably, a spin-echo signal.

The preferred embodiments of the invention will be described in detail with reference to a variant of the well known FT technique, which is frequently referred to as "spin-warp". The spin-warp technique is discussed in an article entitled "Spin Warp NMR Imaging and Applications to Human Whole-Body Imaging" by W. A. Edelstein et al., *Physics in Medicine and Biology*, Vol. 25, pp. 751–756 (1980).

The spin-warp technique employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a read-out magnetic field gradient ($G_x$) in a direction orthogonal to the phase encoding direction. The read-out gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

Object motion during the acquisition of NMR image data produces both blurring and "ghosts" in the phase-encoded direction. Ghosts are particularly apparent when the motion is periodic, or nearly so. For most physiological motion each view of the NMR signal is acquired in a period short enough that the object may be considered stationary during the acquisition window. In such case the ghosting is due to the inconsistent appearance of the object from view to view. The primary source of such ghosts is patient motion due to respiration or the cardiac cycle. Ghosting can be reduced if the data acquisition is synchronized with the functional cycle of the patient to reduce view-to-view motion. This method is known as gated NMR scanning, and its objective is to acquire NMR data at the same point during successive functional cycles so that the object "looks" the same in each view. The drawback of gating is that NMR data may be acquired only during a small fraction of the patient's functional cycle, and even when the shortest acceptable pulse sequence is employed, the gating technique can significantly lengthen the data acquisition time. Some of these methods are disclosed in U.S. Pat. Nos. 4,751,462; 4,567,893 and 4,663,591. None of them have proven entirely satisfactory because they either depend upon perfectly periodic motion, or they increase the scan time significantly, or they produce low signal-to-noise images.

A number of other techniques for eliminating ghost artifacts in NMR images have been proposed. Some of these involve changes in the data acquisition process such as that disclosed in U.S. Pat. No. 4,715,383 or U.S. Pat. No. 4,937,526. These techniques may be difficult to implement or may require performance trade offs.

SUMMARY OF THE INVENTION

The present invention relates to a method and apparatus for producing NMR images in which ghost artifacts due to periodic or quasi-periodic patient motion are reduced or eliminated. More particularly, the invention includes acquiring a plurality of sets of NMR data, reconstructing a corresponding plurality of sets of NMR image data; calculating a corrected set of NMR image data using the corresponding elements in each of the plurality of sets of NMR image data; and producing an image from the corrected set of NMR image data. Each set of NMR image data is viewed as containing image data ($I_0$) which corresponds to the actual object and a ghost mask (g). The ghost masks (g) change during the set of acquisitions, but they are correlated such that the value of the actual object data ($I_0$) can be calculated from the sets of NMR image data.

A general object of the invention is to reduce ghost artifacts in an NMR image. Several sets of NMR data are acquired and processed in the usual manner to produce corresponding sets of NMR image data ($I_1, I_2, \ldots I_n$). Each set of NMR image data contains data ($I_0$) that correctly depicts the patient and data (g) which represents ghosting. This can be expressed as follows:

$$
\begin{aligned}
I_1 &= I_0 + g_1 \\
I_2 &= I_0 + g_2 \\
&\vdots \\
I_n &= I_0 + g_n
\end{aligned}
\tag{2}
$$

where $I_1, I_2, \ldots I_n$ are the complex NMR image data sets, $I_0$ is the correct image data set to be calculated, and $g_1, g_2, \ldots g_n$ are the ghost masks which differ in the data sets. The ghost masks can be correlated by the manner in which the sets of NMR data are acquired and can, therefore, be related to each other by a formula. For example, if three data sets are acquired, the ghost mask $g_2$ may be viewed as an average of the ghost masks $g_1$ and $g_3$, and this correlation results in the following relationship between the three ghost masks:

$$g_1 \cdot g_3 = g_2^2 \tag{3}$$

Substituting equation (3) into equations (2), the value of the correct image data ($I_0$) can then be calculated as follows:

$$I_0 = (I_1 \cdot I_3 - I_2^2)/(I_1 + I_3 - 2I_2). \tag{4}$$

To the extent that the ghost masks can be accurately correlated, the ghosts can be removed from the reconstructed image by calculating the corrected data ($I_0$).

Another object of the invention is to provide a data acquisition sequence in which highly correlated sets of NMR image data can be acquired and corrected. The data for the image data sets $I_1, I_2, \ldots I_n$ is acquired in an interleaved scan. The scan is comprised of a series of cycles in which each cycle acquires one view for each of the three data sets. The cycle repeats until all views have been acquired.

A more specific object of the invention is to acquire a plurality of NMR data sets in which the ghost masks are different, but correlated. The data for each separate NMR data set is acquired in an interleaved manner with the same TR period, or even within the same TE period or the same data acquisition window. If the interleaving is very close in time, additional "kicker" gradient pulses may be employed in the pulse sequence to insure that the ghost signals remain correlated but are not identical.

The foregoing and other objects and advantages of the invention will appear from the following description. In the description, reference is made to the accompanying drawings which from a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
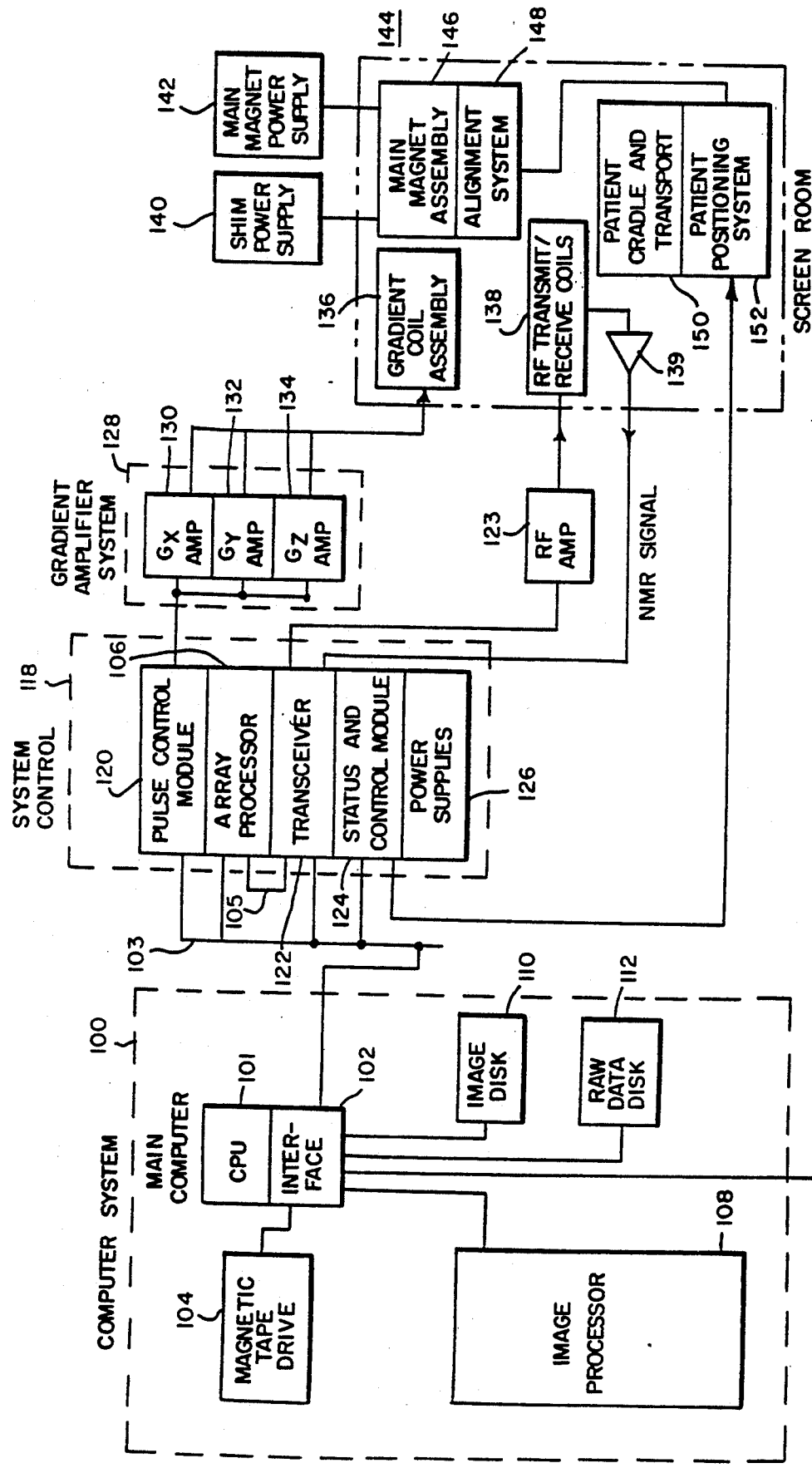
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and realtime data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 36 and which is part of a magnet assembly 146. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 128 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize shim coil associated with the main magnet and which are used to correct inhomogeneities in the polarizing magnet field. In the case of a resistive magnet, main magnet power supply 142 is utilized to continuously energize the magnet. In the case of a superconductive magnet, the main power supply 142 is utilized to bring the polarizing field produced by the magnet to the proper operating strength and is then disconnected. In the case of a permanent magnet, power supply 142 would not be needed. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient-handling devices, are enclosed in an RF-shielded room generally designated 144.

Figure 2:
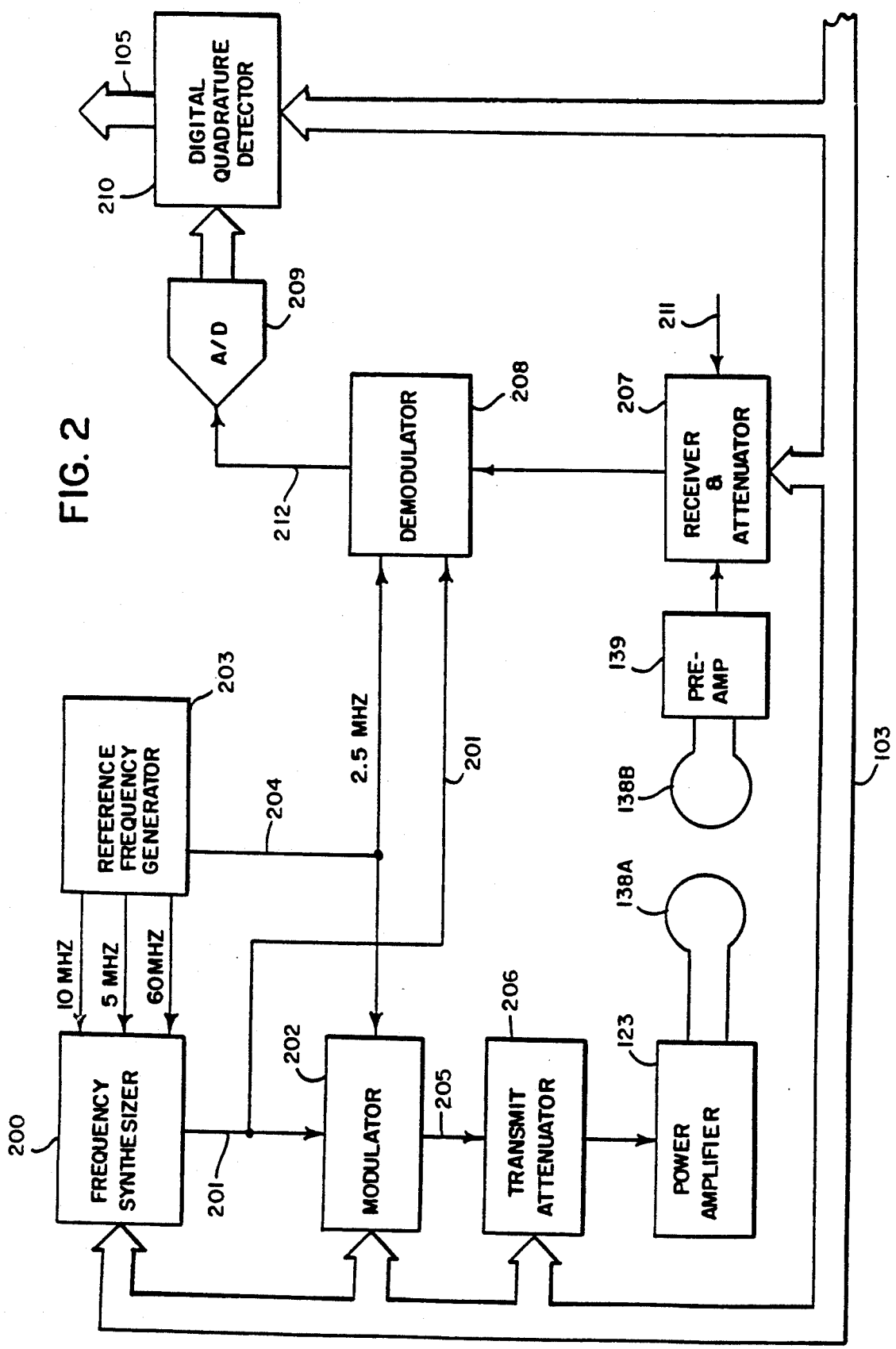
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF Carrier is applied to a modulator 202 where it is modulated in response to a signal R(t) received through bus 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
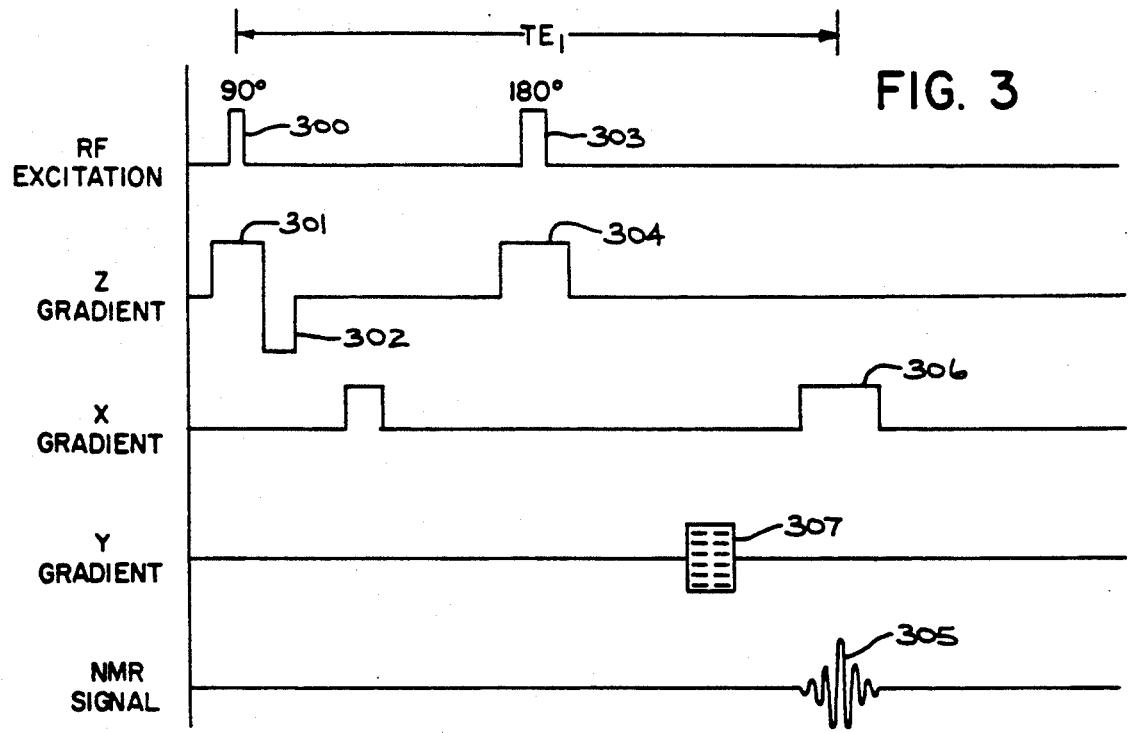
FIG. 3 is a graphic representation of a conventional NMR pulse sequence used to acquire data to produce an image.

The NMR system of FIG. 1 performs a series of pulse sequences to collect sufficient NMR data to reconstruct an image. One such pulse sequence is shown in FIG. 3. This sequence performs a slice selection by applying a 90° selective RF excitation pulse 300 in the presence of a z axis gradient pulse 301 and its associated rephasing pulse 302. After an interval $TE_1/2$, a 180° selective RF excitation pulse 303 is applied in the presence of another z axis gradient pulse 304 to refocus the transverse magnetization at the time $TE_1$ and produce an echo NMR signal 305.

To position encode the echo NMR signal 305, an x axis read-out gradient pulse 306 is applied during the acquisition of the NMR signal 305. The read-out gradient frequency encodes the NMR signal 305 in the well known manner. In addition, the echo NMR signal 305 is position encoded along the y axis by a phase encoding gradient pulse 307. The phase encoding gradient pulse 307 has one strength during each echo pulse sequence and associated NMR echo signal 305, and it is typically incremented in steps through 256 discrete strengths ($-128$ to $+128$) during the entire scan. As a result, each of the 256 NMR echo signals 305 acquired during the scan is uniquely phase encoded.

It is, of course, usual practice to repeat the pulse sequence for each phase encoding gradient value one or more times and to combine the acquired NMR signals in some manner to improve signal-to-noise and to offset irregularities in the magnetic fields. In the following discussion, it is assumed that such techniques may be used to acquire the NMR data set which is to be corrected. In the preferred embodiment and echo time (TE) of 20 milliseconds is employed and a repetition rate (TR) of 200 milliseconds is used, however, it should be apparent to those skilled in the art that many other pulse sequences may be employed to acquire the NMR data sets necessary to practice the present invention.

Figure 4:
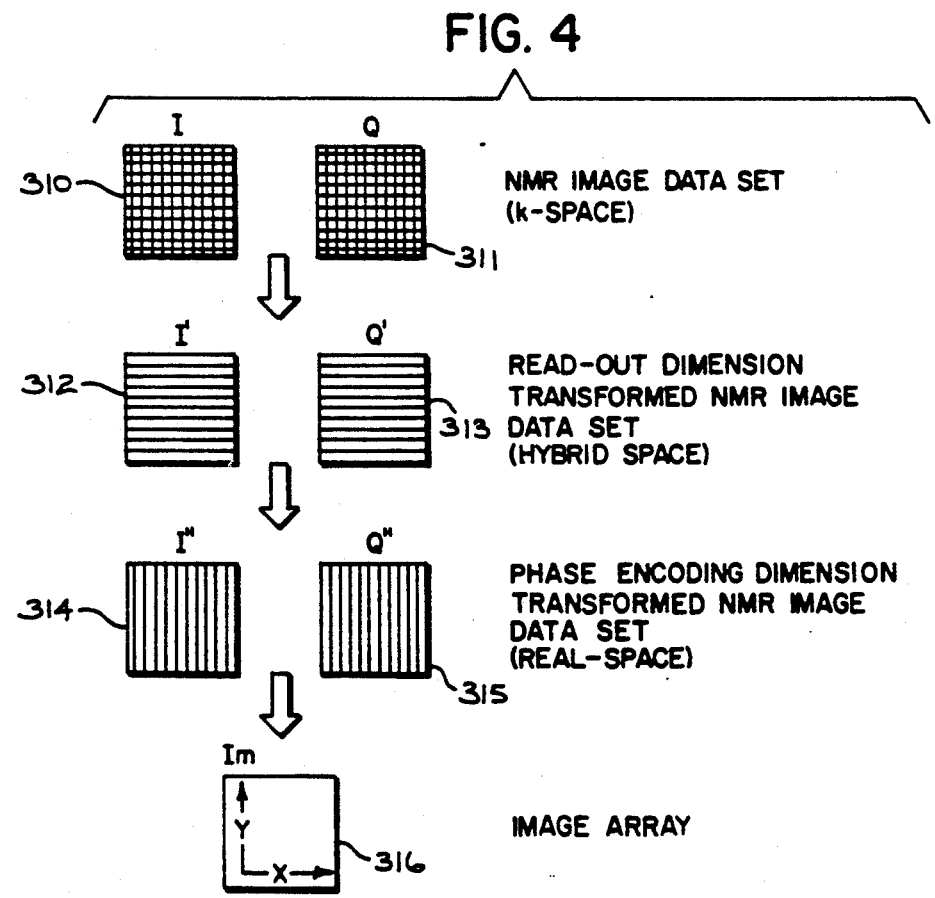
FIG. 4 is a pictorial representation of how an image is reconstructed from NMR data acquired using the pulse sequence of FIG. 3.

Referring particularly to FIG. 4, the acquired NMR data is stored in the data disk 112 (FIG. 1) in the form of two 256×256 element arrays 310 and 311. The array 310 contains the in-phase magnitude values I and the array 311 contains the quadrature values Q. Together these arrays 310 and 311 form an NMR image data set which defines the acquired image in what is referred to in the art as "k-space".

To convert this k-space NMR data set into data which defines the image in real space (i.e. Cartesian coordinates), a two step Fourier transformation is performed on the I and Q arrays 310 and 311. The transformation is performed first in the read-out direction which is the horizontal rows of the arrays 310 and 311 to produce two 256×256 element arrays 312 and 313. The array 312 contains the in-phase data and is labeled I', while the array 313 contains the quadrature data and is labeled Q'. The I' and Q' arrays 312 and 313 define the acquired image in what is referred to in the art as "hybrid-space".

The second transformation is performed in the phase encoding direction which is the vertical columns of the arrays 312 and 313 to produce two 256×256 element arrays 314 and 315. The array 314 contains the transformed in-phase values and is labeled I", while the array 315 contains the quadrature values and is labeled Q". The arrays 314 and 315 are a data set which defines the acquired image in real space and the elements thereof are used to calculate the intensity values in a 256×256 element image array 316 in accordance with the following expression:

$$Im_{xy} = \sqrt{(I_{xy}'')^2 + (Q_{xy}'')^2} \qquad (5)$$

The 256×256 elements of the image array 316 are mapped to the main operator console 116 (FIG. 1) for display on a CRT screen.

The above described NMR system and pulse sequence is representative of the current state of the art. The diagnostic quality of the image which is obtained is determined by the extent to which the acquired NMR signals are degraded. The present invention deals with the degradation of the acquired NMR signals due to periodic or quasi-periodic movement of the patient.

Figure 5:
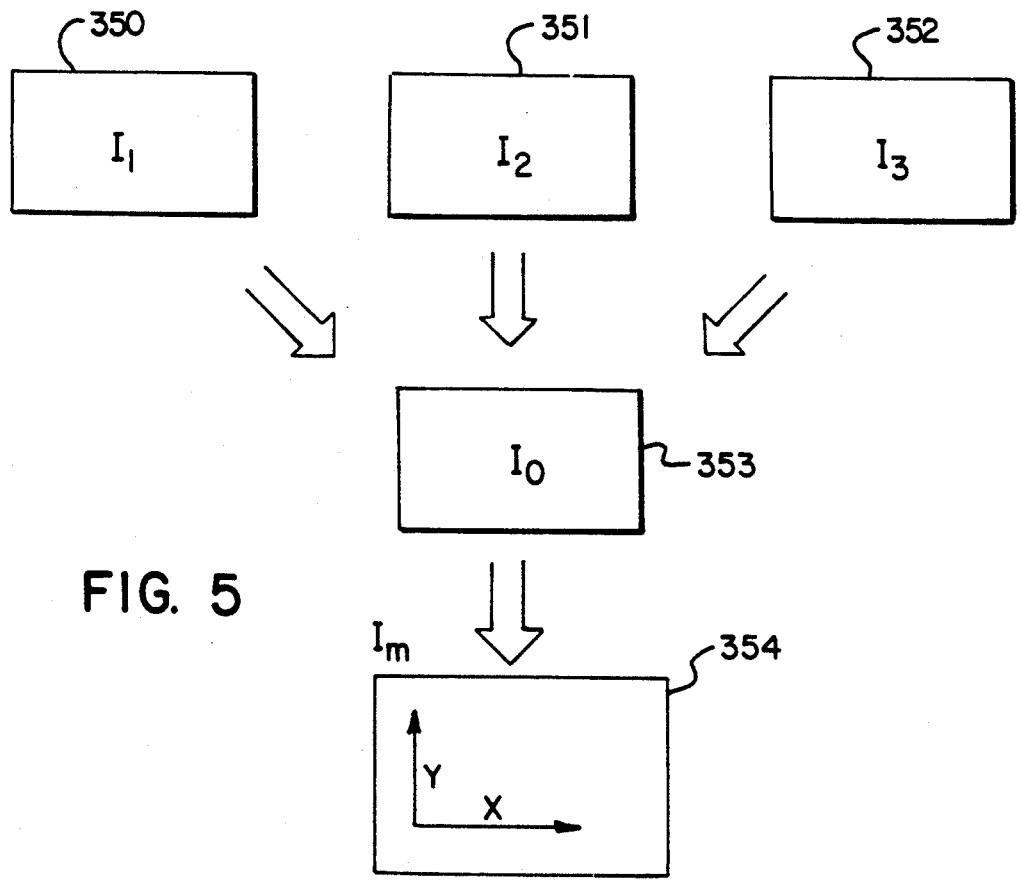
FIG. 5 is a block diagram of the data structures produced when practicing the preferred embodiment of the invention.

Referring particularly to FIG. 5, the preferred method for practicing the present invention employs the pulse sequence of FIG. 3 to acquire three NMR image data sets. Each data set includes 256 views, or phase encodings, and they are acquired in an interleaved manner as will be described in more detail below. The three separate NMR image data sets are processed as described above by performing a two-dimensional Fourier transformation on each. Three 256 by 256 element arrays of complex numbers indicated at 350, 351 and 352 are thus produced and contain data for three images $I_1$, $I_2$ and $I_3$. A discovery of the present invention is that each of these images $I_1$, $I_2$ and $I_3$ contains data which indicates the correct patient condition ($I_0$) as well as data which produces ghosts ($g_1$, $g_2$, $g_3$). In other words, the image data in arrays 350-352 can be expressed as follows:

$$I_1 = I_0 + g_1$$

$$I_2 = I_0 + g_2$$

$$I_3 = I_0 + g_3 \qquad (6)$$

Furthermore, because of the manner in which the data sets are acquired, the ghost data ($g_1$, $g_2$ and $g_3$) is correlated and can be expressed by the following formula:

$$g_1 \cdot g_3 = g_2^2 \qquad (7)$$

This formula indicates that the ghost in the second image $I_2$ is the geometric average of the ghosts from images $I_1$ and $I_3$. As will be explained below, this is true because data for the second image $I_2$ is acquired between the data acquisitions for images $I_1$ and $I_3$.

Equations (6) and (7) can be combined to solve for the value of $I_0$:

$$I_0 = (I_1 \cdot I_3 - I_2^2)/I_1 + I_3 - 2I_2 \qquad (8)$$

This calculation is performed on the image data arrays 350-352 on an element-by-element basis to produce the corresponding elements of a 256×256 corrected image data array 353. The elements are complex numbers and the indicated arithmetic functions are, therefore, computations on the real and imaginary components of each array element.

An image array 354 is produced next from the corrected image data set 353, as described above and indicated in equation (5). The resulting image will be free of ghosts produced by patient motion that is consistent with the correlation formula. For example, the correlation formula applies to remove ghosts caused by the relatively slow movements due to patient respiration.

Figure 6:
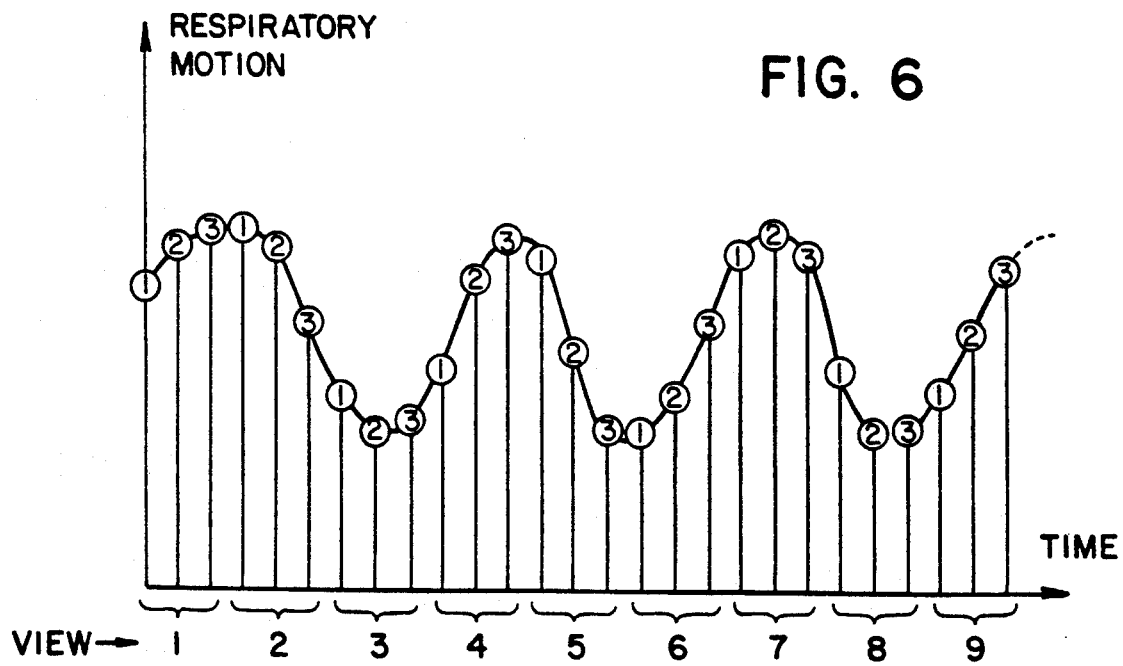
FIG. 6 is a graphic representation of the data acquisition sequence relative to the patient's respiratory cycle when practicing the preferred embodiment of the invention.

The correlation of the ghost masks and the resulting correlation formula is determined by the manner in which the three image data sets $I_1$, $I_2$ and $I_3$ are acquired. Referring to FIG. 6, in the preferred embodiment the acquisition of each view for the three data sets are interleaved such that they occur as close as possible in time. As a result, the data for each view of the second data set $I_2$ is acquired between the acquisition of the data for the first and third data sets $I_1$ and $I_3$. To a first approximation, the position of the patient at the time the second data set $I_2$ is acquired is the average of the positions of the patient at the times the first and third data sets $I_1$ and $I_3$ are acquired. To a first approximation, therefore, the ghost mask $g_2$ is the average of the ghost masks $g_1$ and $g_3$ and equation (7) is correct. It can be appreciated, however, that this correlation is correct only because patient motion due to respiration is relatively slow compared to the data acquisition sample rate.

A practical problem exists when the present invention is employed as described above. This problem occurs when the values of the image data $I_1$, $I_2$ and $I_3$ are such that the denominator in equation (8) is near zero. When this occurs a singular solution for $I_0$ results and an image artifact is produced. To prevent this from occurring, the data acquisition sequence is changed to introduce significant "phase twists" in the ghost masks.

Phase twists are introduced into the three ghost masks $g_1$, $g_2$, and $g_3$ by shifting the phase encoding orders of the three acquired image data sets $I_1$, $I_2$, and $I_3$. As indicated above, one view for each of the data sets $I_1$, $I_2$, and $I_3$ is acquired in an interleaved manner and then the phase encoding gradient is incremented $\Delta G_y$ to acquire the next view for each data set. A phase twist is introduced by shifting the view number for each set of three interleaved acquisition such that if the second acquisition ($I_1$) is being acquired at phase encoding k, then the first and third acquisition ($I_1$ and $I_3$) are phase encoded by k-$\Delta$k respectively. The shift $\Delta$k is three in the preferred embodiment and this shift is maintained throughout the entire scan of 256 views. At the completion of the scan the data in the first image data array 350 is shifted up three rows and the data in the third image data array 352 is shifted down three rows. This procedure does nothing to the $I_0$ component in each image, but the ghost component in each will be phase twisted so that the denominator in equation (8) will not approach zero in value. The validity of equation (7) is not destroyed by this procedure.

Figure 7:
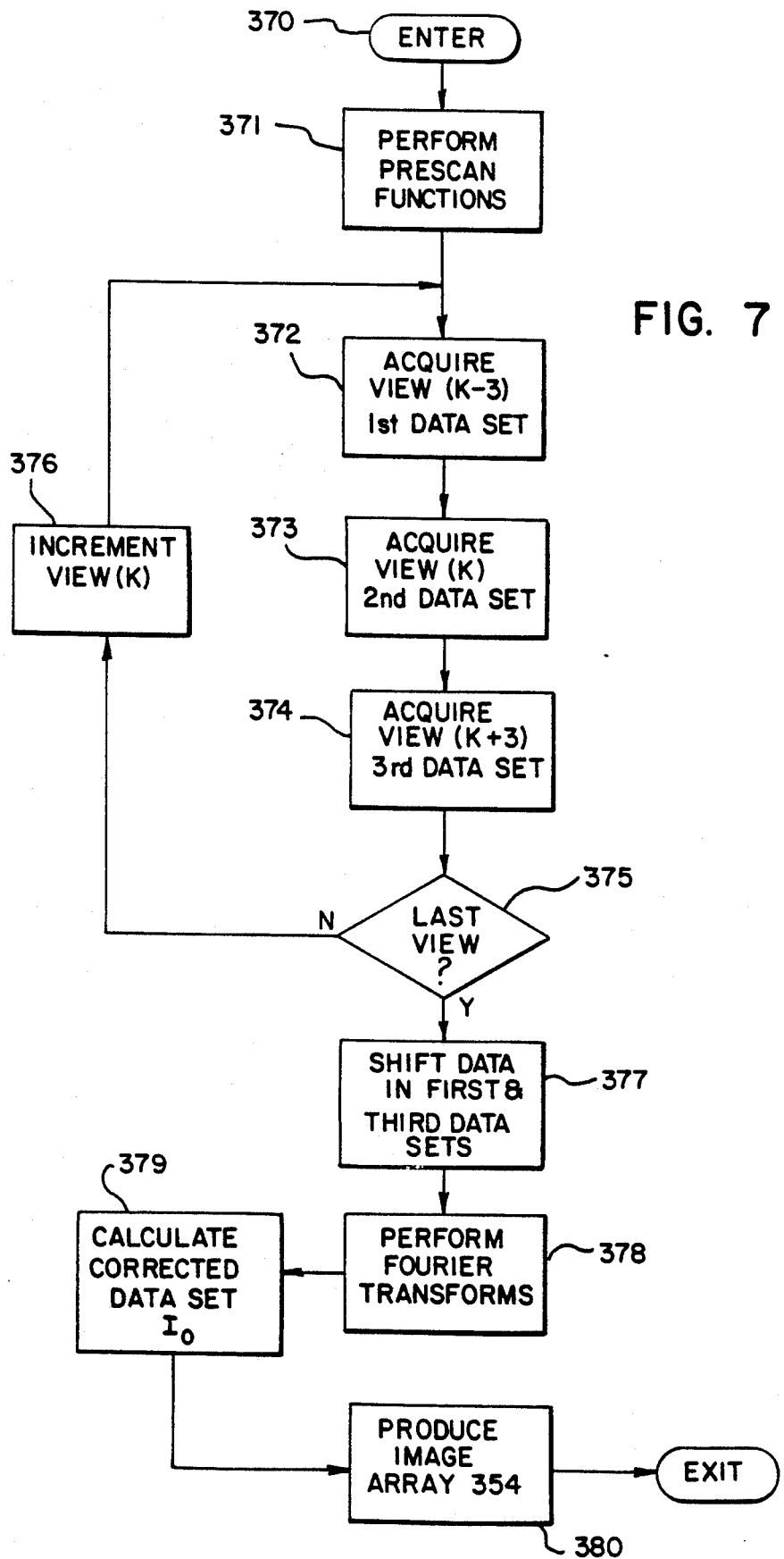
FIG. 7 is a flow chart of a program executed by the NMR system of FIG. 1 to carry out the preferred embodiment of the present invention.

The preferred embodiment of the present invention is performed by the NMR system of FIG. 1 under the direction of a stored program executed by its main computer 101. Referring to FIG. 7, this program is entered at 370 when executed and it performs a number of well known prescan functions, such as system calibrations, as indicated at process block 371. A loop is then entered in which three sets of image data are acquired. The pulse sequence of FIG. 3 is executed to acquire a view of the first image data set as indicated at process block 372. The pulse sequence is repeated to acquire a view of the second image data set at process block 373, and the pulse sequence is repeated again at process block 374 to acquire a view for the third image data set. The phase encoding gradient $G_y$ is different in each of these three pulse sequences, however, such that the view number for the first data set is three less than the view number for the second data set, and the view number for the third data set is three more than the view number for the second data set. When all 256 views have been acquired, as determined at decision block 375, the scan is complete and image reconstruction begins. Otherwise, the view number (k) is incremented by one at block 376 and another series of three pulse sequences is performed.

As indicated at process block 377, the first step in reconstructing an image is to reorder the acquired date in the three image data sets. This is accomplished by shifting the rows of data in the first and third image data sets such that they correspond with the views acquired in each of the 256 rows of the second image data set. Then, as indicated at process block 378, a conventional two-dimensional Fourier transformation is performed on each of the three image data sets to produce the three image data sets $I_1$, $I_2$ and $I_3$. Using the formula in equation (8) the value of each complex number in the $I_0$ array 353 is then calculated at process block 379. At locations where the value of $I_0$ is disproportionately large due to the denominator in equation (8) approaching zero, the value is replaced with a value equal to the average of the $I_0$ values at surrounding pixels. And finally, an image array 354 is calculated at process block 380 using the formula in equation (5) on the real and imaginary components of each element in the $I_0$ data set 353. The resulting image array 354 may be displayed on a CRT or stored for later use.

In the preferred embodiment described above three NMR data sets are acquired by interleaving the acquisition of their phase encoding views during the same TR period. This works well for suppressing artifacts due to patient respiration, but when the characteristic time of the motion is much shorter, the ghost patterns are not well correlated and the improvement in image quality may not be as good. This is true, for example, where cardiac motion is involved in producing the ghosts.

Figure 8:
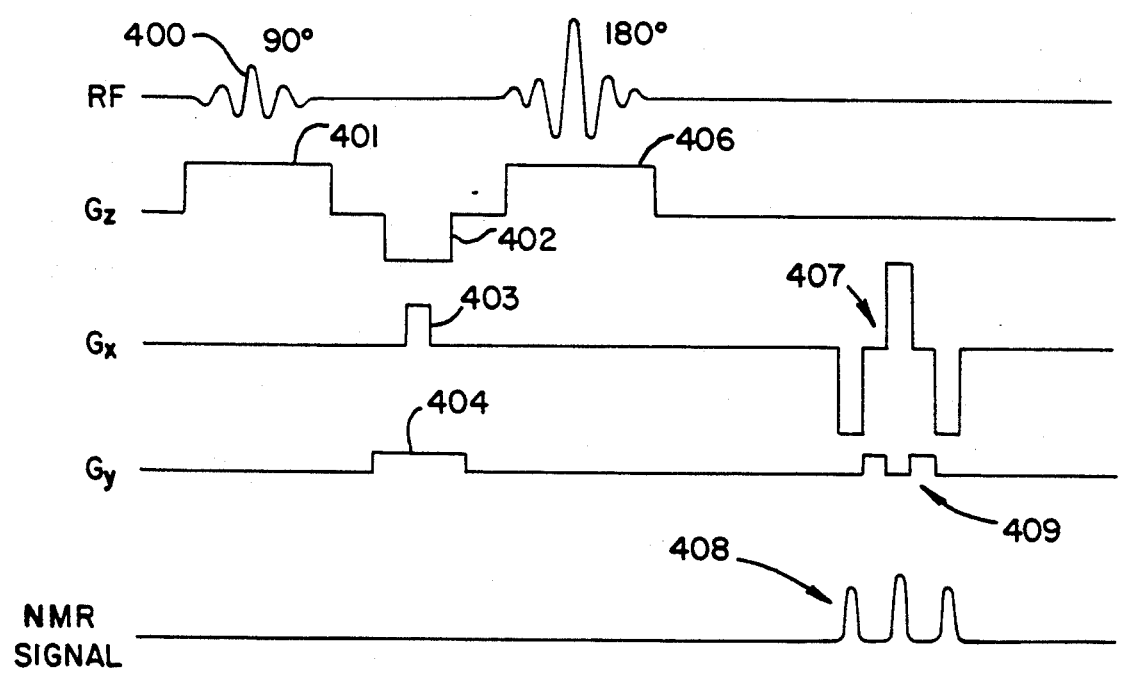
FIG. 8 is an alternative to the pulse sequence of FIG. 3.

One solution to this problem is to shorten the time period during which the data for each of the NMR data sets is acquired. Referring to FIG. 8, for example, the data for each of the NMR data sets $I_1-I_n$ can be acquired in the same pulse sequence. The pulse sequence of FIG. 8 is an echo-planar pulse sequence which employs a selective 90° RF excitation pulse 400 which is produced in the presence of a slice select $G_z$ gradient pulse 401 to excite spins in a selected slice through the subject. The $G_z$ gradient pulse 401 is followed by a $G_z$ rephasing pulse 402 which operates in the well known manner to rephase the excited spins in the selected slice so that the proper phase is restored for subsequent phase encoding. Concurrently, a dephasing $G_x$ gradient pulse 403 is produced and a $G_y$ phase encoding pulse 404 is produced. The orientation of the transverse magnetization is then reversed by the application of a selective 180° RF excitation pulse 405 which is produced in the presence of a slice select $G_z$ gradient pulse 406. A series of NMR signals S(t) are then acquired by the application of a series of $G_x$ readout gradient pulses 407 which alternate in polarity to produce a corresponding series of gradient recalled echo signals 408. The $G_x$ pulses 407 are spaced apart and "kicker" $G_y$ phase encoding pulses 409 are produced therebetween to separately phase encode each acquired gradient echo signal 408. The kicker gradient pulses 409 insure that the ghosts have a relative phase with respect to each other, but they do not destroy the correlation. In this second embodiment three views are obtained during each pulse sequence, but it can be appreciated by those skilled in the art that the number of views per pulse sequence and the number of pulse sequences per scan can be altered as desired. The important consideration is that the corresponding views for each data set $I_1-I_n$ be acquired during the same pulse sequence so that the ghosts will correlate even at the relatively high frequencies associated with cardiac motion.

We claim:

1. In an NMR system for producing an image of an object which is subject to motion, a method for masking image artifacts produced by the motion which comprises:

acquiring a first image data set containing a component $I_0$ indicative of the object and a ghost component $g_1$ indicative of image artifacts;

acquiring a second image data set containing a component $I_0$ indicative of the object and a ghost component $g_2$ indicative of image artifacts and correlated with the ghost component $g_1$;

acquiring a third image data set containing a component $I_0$ indicative of the object and a ghost component $g_3$ indicative of image artifacts and correlated with the ghost component $g_1$ and $g_2$;

transforming the three acquired image data sets to produce corresponding transformed image data sets $I_1$, $I_2$ and $I_3$;

calculating a corrected image data set from the values of corresponding elements in the three transformed image data sets $I_1$, $I_2$ and $I_3$, such that the corrected image data contains the object component $I_0$, but the ghost correlated components $g_1$, $g_2$ and $g_3$ are substantially eliminated; and producing an image from the corrected image data sets.

2. The method as recited in claim 1 in which the calculation of the object component $I_0$ in the corrected image data set is accomplished according to the expression:

$$I_0 = (I_1 \cdot I_3 - I_2^2)/(I_1 + I_3 - 2I_2).$$

3. The method as recited in claim 1 in which the transformation is a two-dimensional Fourier transformation.

4. The method as recited in claim 1 in which each image data set is acquired as a series of views in which a phase encoding gradient is stepped through a sequence of discrete values, and the views for the three image data sets are interleaved such that each view for the second image data set is acquired between the acquisition of a view for the first image data set and a view for the third image data set.

5. The method as recited in claim 4 in which the transformation is a two dimensional Fourier transformation.

6. The method as recited in claim 5 in which the calculation of the object component $I_0$ in the corrected image data set is accomplished according to the expression:

$$I_0 = (I_1 \cdot I_3 - I_2^2)/(I_1 + I_3 - 2I_2).$$

7. The method as recited in claim 6 in which the phase encoding gradients are stepped through the same sequence of discrete values for each of the three acquired image data sets.

8. The method as recited in claim 7 in which the value of the phase encoding gradient for each view for the second image data set is different than the values of the phase encoding gradients for the first and third image data set views acquired immediately before and immediately thereafter.

9. In an NMR system for producing an image of an object which is subject to motion, a method for masking image artifacts produced by the motion which comprises:

acquiring a plurality of NMR image data sets, each NMR image data set including a plurality of phase encoding views and the corresponding phase encoding views in each of said plurality of NMR image data sets is acquired within a time interval which is short relative to the characteristic time interval of the artifact producing motion such that ghost components in each of the plurality of phase encoding views are correlated;

Fourier transforming the acquired plurality of NMR image data sets to produce corresponding transformed image data sets;

calculating a corrected image data set from the values of corresponding elements in the transformed image data sets such that the corrected image data contains an object component $I_0$ that is common to all of the transformed image data sets and the correlated ghost components are substantially eliminated; and producing an image from the corrected image data set.

* * * * *